United States Patent [19]

Candy et al.

[11] 4,032,914

[45] June 28, 1977

[54] ANALOG TO DIGITAL CONVERTER WITH NOISE SUPPRESSION

[75] Inventors: James Charles Candy, Convent Station; Yau-Chau Ching, Morganville, both of N.J.

[73] Assignee: Bell Telephone Laboratories, Incorporated, Murray Hill, N.J.

[22] Filed: Apr. 23, 1976

[21] Appl. No.: 679,774

[52] U.S. Cl. .......................................... 340/347 AD
[51] Int. Cl.² ..................................... H03K 13/175
[58] Field of Search ... 340/347 AD, 347 M, 347 NT; 324/99 D; 325/38 R

[56] References Cited

UNITED STATES PATENTS

| | | | |
|---|---|---|---|
| 3,192,371 | 6/1965 | Brahm | 340/347 AD |
| 3,716,849 | 2/1973 | Metcalf | 340/347 AD |
| 3,879,724 | 4/1975 | McDonald | 340/347 AD |

OTHER PUBLICATIONS

Saufley et al., "Rev. Sci. Instrum., vol. 45, No. 7, July 1974, pp. 882–887.

*Primary Examiner*—Charles D. Miller
*Attorney, Agent, or Firm*—John Francis Moran

[57] ABSTRACT

An analog signal to be converted into a high resolution digital signal is first converted to a coarsely quantized signal by a direct feedback coder. A group of successive coarsely quantized signals are then processed by a converter which produces the high resolution digital signal. In the converter, the processing is performed by an arrangement of two accumulators. The first accumulator provides an output signal indicative of the running sum of each group of coarsely quantized signals. The second accumulator has the capability of providing an accumulation of either the negative or the positive of the output signal of the first accumulator. A negative accumulation is used for a first portion of the group and a positive accumulation is used for the second portion of the group to provide a net sum. The net sum is a triangularly weighted accumulation of the successive signals in the group which occasions self-cancelling of the quantizing noise inherent to the direct feedback coder. Each net sum is used to form a code word of several digital bits in a high accuracy signal. Utilization of a third portion between the first and second portions of the group in which the second accumulator is idle provides a trapezoidal weighting in the net sum. The latter weighting provides a further improvement in resolution and accuracy.

9 Claims, 8 Drawing Figures

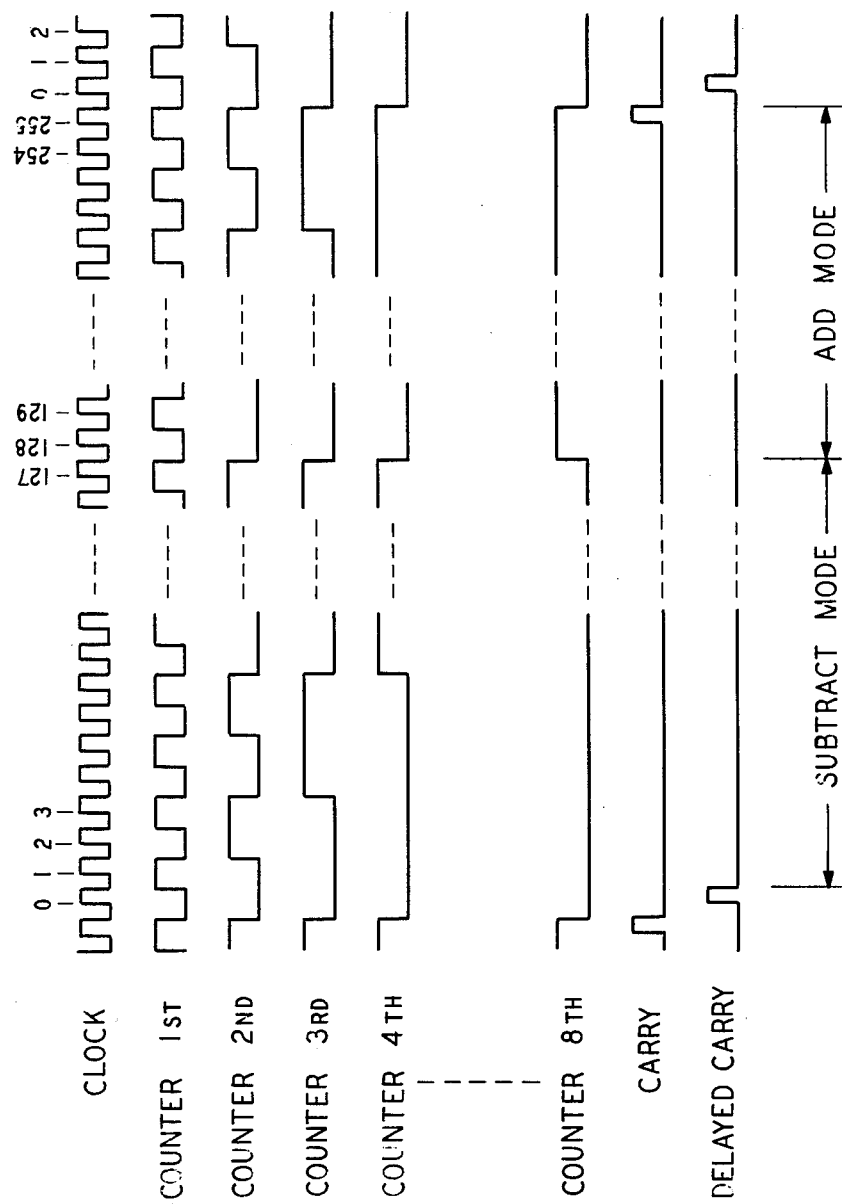

FIG. 3

| FIRST CODE GROUP | CONTENTS OF REGISTER 21 OF FIG. 1 | MODE | CONTENTS OF REGISTER 28 OF FIG. 1 |
|---|---|---|---|
| $Q_0$ | 0(RESET) | + | OUTPUT FROM PRIOR ACCUMULATION CYCLE |
| $Q_1$ | $Q_1$ | − | 0(RESET) |
| $Q_2$ | $Q_1+Q_2$ | − | $-Q_1$ |
| $Q_3$ | $Q_1+Q_2+Q_3$ | − | $-2Q_1-Q_2$ |
| ----- | ----- | − | $-3Q_1-2Q_2-Q_3$ |
| $Q_n$ | $Q_1+Q_2+Q_3---Q_n$ | − | $-nQ_1-(n-1)Q_2-(n-2)Q_3---Q_n$ |
| $Q_{(m+1)}$ | $Q_1+Q_2+Q_3---Q_n+Q_{(m+1)}$ | + | $-(n-1)Q_1-(n-2)Q_2-(n-3)Q_3---Q_{(n-1)}-Q_n$ |
| $Q_{(m+2)}$ | $Q_1+Q_2+Q_3---Q_n+Q_{(m+1)}+Q_{(m+2)}$ | + | $-(n-2)Q_1-(n-3)Q_2-(n-4)Q_3---Q_{(n-1)}+Q_{(n+1)}$ |
| $Q_{(m+3)}$ | $Q_1+Q_2+Q_3---Q_n+Q_{(m+1)}+Q_{(m+2)}+Q_{(m+3)}$ | + | $-(n-3)Q_1-(n-4)Q_2-(n-5)Q_3---+2Q_{(m+1)}+Q_{(m+2)}$ |
| ----- | ----- | + | $3Q_{(m+1)}+2Q_{(m+2)}+Q_{(m+3)}$ |
| $Q_{(m+p)}$ | $Q_1+Q_2+Q_3---Q_n+Q_{(m+1)}+Q_{(m+2)}+Q_{(m+3)}---Q_{(m+p)}$ | + | $Q_1+2Q_2+3Q_3---(n-1)Q_{(n-1)}+nQ_n+(n+1)Q_{(m+1)}---+Q_{(n+p)}$ |
| $Q_0$ | 0(RESET) | − | 0(RESET) |
| $Q_1$ | $Q_1$ | | |

ACCUMULATION CYCLE — 1ST PORTION — 2ND PORTION

FIG. 7

| FIRST CODE GROUP | CONTENTS OF REGISTER 22 OF FIG. 5 | MODE | CONTENTS OF REGISTER 28 OF FIG. 5 |
|---|---|---|---|
| $Q_0$ | 0 (RESET) | + | OUTPUT FROM PRIOR ACCUMULATION CYCLE |
| $Q_1$ | $Q_1$ | − | 0 (RESET) |
| $Q_2$ | $Q_1+Q_2$ | − | $-Q_1$ |
| $Q_3$ | $Q_1+Q_2+Q_3$ | − | $-2Q_1-Q_2$ |
| --- | --- | − | $-3Q_1-2Q_2-Q_3$ |
| $Q_p$ | $Q_1+Q_2+Q_3\text{---}Q_p$ | − | $-pQ_1-(p-1)Q_2-(p-2)Q_3\text{---}2Q_{p-1}-Q_p$ |
| $Q_{p+1}$ | $Q_1+Q_2+Q_3\text{---}Q_p+Q_{p+1}$ | 0 | $-pQ_1-(p-1)Q_2-(p-2)Q_3\text{---}2Q_{p-1}-Q_p$ |
| $Q_i$ | $Q_1+Q_2+Q_3\text{---}Q_p\text{---}Q_i$ | 0 | $-pQ_1-(p-1)Q_2-(p-2)Q_3\text{---}2Q_{p-1}-Q_p,\; p<i<n-p$ |
| $Q_{p+x}$ | $Q_1+Q_2+Q_3\text{---}Q_p\text{---}Q_{p+x}$ | 0 | $-pQ_1-(p-1)Q_2-(p-2)Q_3\text{---}2Q_{p-1}-Q_p$ |
| $Q_{n-p}$ | $Q_1+Q_2+Q_3\text{---}Q_p\text{---}Q_i\text{---}Q_{n-p}$ | + | $-(p-1)Q_1-(p-2)Q_2-(p-3)Q_3\text{---}Q_{p-1}+0+Q_{n-p}$ |
| $Q_{n-p+1}$ | $Q_1+Q_2+Q_3\text{---}Q_p\text{---}Q_i\text{---}Q_{n-p+1}$ | + | $-(p-2)Q_1-(p-3)Q_2-(p-4)Q_3\text{---}0+Q_p+2Q_{n-p}+Q_{n-p+1}$ |
| --- | --- | + | $0+Q_2+2Q_3\text{---}(p-1)Q_p+PQ_{p+1}\text{---}PQ_i+PQ_{n-p}+(p-1)Q_{n-p+1}+Q_{n-1}$ |
| $Q_{n-1}$ | $Q_1+Q_2+Q_3\text{---}Q_{n-1}$ | + | $Q_1+2Q_2+3Q_3\text{---}PQ_p+(P+1)Q_{p+1}\text{---}(P+1)Q_i+(P+1)Q_{n-p}+PQ_{n-p+1}\text{---}2Q_{n-1}+Q_n$ |
| $Q_n$ | $Q_1+Q_2+Q_3\text{---}Q_n$ | − | 0 (RESET) |
| $Q_0$ | 0 (RESET) | | |
| $Q_1$ | $Q_1$ | | |

ACCUMULATION CYCLE: 1ST PORTION — 2ND PORTION — 3RD PORTION

ANALOG TO DIGITAL CONVERTER WITH NOISE SUPPRESSION

BACKGROUND OF THE INVENTION

This invention relates to digital signal processing and, more particularly, to analog-to-digital conversion in digital message transmission systems of a coarsely quantized digital signal into a high resolution digital signal including code groups of several digit positions.

A number of prior art encoders have been developed which utilize high speed sampling and encoding at many times the Nyquist rate to make up for a lack of precision or accuracy in their operation. Such a tradeoff significantly reduces the amount of hardware otherwise required by a straightforward analog-to-digital conversion of each sampled analog signal into a high resolution code word or group of several digits. In one of these arrangements, a number of digits from a high speed delta modulator are combined by digital multipliers to produce a pulse code modulated (PCM) signal. A disadvantage of this arrangement is that the delta modulator must operate at extremely high speeds to provide a high resolution PCM signal. If a slower running multiple level coder producing a plurality of encoded digits was utilized instead of a delta modulator, complex and expensive digital multipliers would be required instead of simple gates to provide the weighted accumulation that provides the high resolution PCM signal. Furthermore, in this arrangement even when a delta modulator is employed the statistics of the input analog signal must be known to select the most favorable coefficients of the multipliers to provide a PCM signal of high resolution by minimizing the cumulative effect of quantizing noise.

In another arrangement a number of code groups produced by a high speed multiple bit direct feedback coder are averaged. The averaging technique takes advantage of a self-cancelling characteristic imposed upon the quantizing noise by the configuration of the coder. This is due to the location of the integrator in the forward signal path of the quantizer instead of the feedback path of the subtractor. Hence, this is the basic for the name of direct feedback coder. The arrangement is therefore able to provide a signal of improved resolution without employing complex digital multipliers.

A primary object of this invention is to combine a number of multiple bit code groups produced by a direct feedback encoder to provide a PCM signal of higher resolution than was obtainable through prior art techniques.

A related object of the invention is to provide an arrangement that performs weighted accumulation of multiple bit code groups to produce a high resolution PCM signal without employing complex digital multipliers.

SUMMARY OF THE INVENTION

The invention in its various aspects takes the form of a signal converter that obviates the use of digital multipliers by an arrangement of two accumulators which perform a weighting process on a plurality of successive coarsely quantized signals each of which is represented by a plurality of digits. The weighting process in the signal converter provides a digitally encoded signal of high signal resolution. In some of its more specific aspects, a variation in the interval of time that the contents of the first accumulator are transferred to the second accumulator provides a different weighting function and a further improvement in signal resolution.

In some of its broader aspects, the invention takes the form of a converter that processes a plurality of code groups from a direct feedback coder to provide a high resolution digital signal including code groups of several digital bits. The converter has a first accumulator which receives each of the code groups and provides an output signal indicative of a running sum of a predetermined plurality of the code groups. The converter also has a second accumulator connected to receive the output of the first accumulator and sum the negative of same for one portion of the predetermined plurality and sums the positive of same for another portion of the predetermined plurality to produce a net sum. The net sum includes successive outputs of the coder during the one portion an increasing number of times and successive outputs of the coder during the other portion a decreasing number of times. From each net sum, a second code group of several digital bits is produced to form the pulse code modulated signal.

In some of its more specific aspects, the invention utilizes output signals of a timer to define the one portion and the other portion of the predetermined plurality and to reset the two accumulators to zero. The timer also defines a third portion of the predetermined plurality and indicates same to the second accumulator. The second accumulator remains idle during the third portion and inhibits the output of the first accumulator from altering its contents. Two illustrative embodiments utilizing weighted accumulation are disclosed: one provides triangular weighting and the other provides trapezoidal weighting.

BRIEF DESCRIPTION OF THE DRAWINGS

Additional objects of the invention and features of the invention become more readily appreciated and better understood by reference to the following detailed description which should be considered in conjunction with the drawings:

FIG. 2 is a waveform diagram demonstrating the operation of the arrangement of FIG. 1;

FIG. 3 is a table representing the signals associated with the various components shown in FIG. 1;

FIG. 7 is a table of signals similar to FIG. 3 which represents signals produced by the components of the arrangement of FIG. 5;

DETAILED DESCRIPTION

Figure 1:
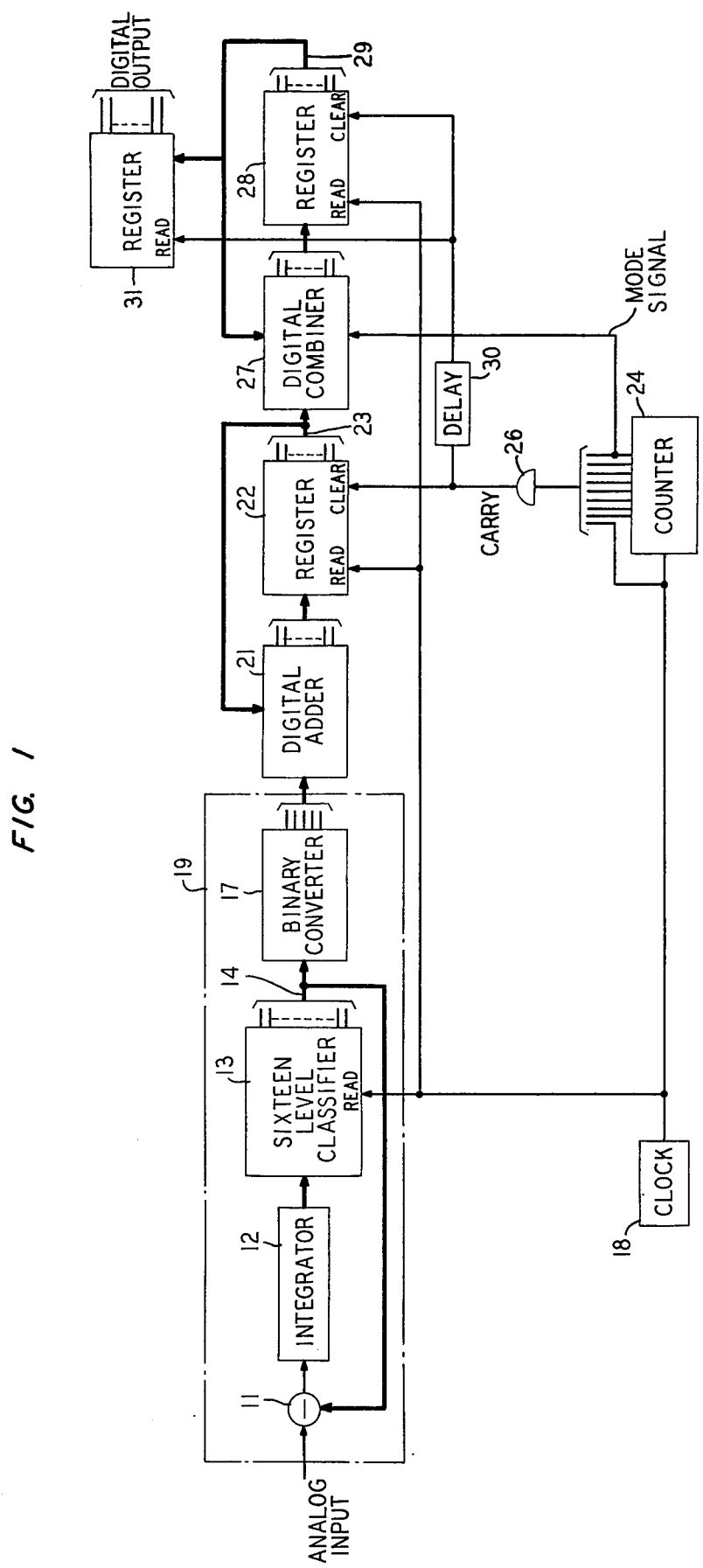
FIG. 1 is a block diagram arranged to operate in accordance with the principles of the invention.

In FIG. 1, an analog signal to be encoded in digital form is applied to subtractor 11. The output of subtractor 11 is applied to integrator 12 whose output is applied to 16-threshold classifier 13. Classifier 13 has 16 outputs which are connected by bus 14 back to the other input of subtractor 11 and also binary converter 17. Classifier 13 samples the output of integrator 12 in accordance with pulses produced by clock 18. The output of classifier 13 then indicates one of 17 coarse quantization levels on bus 14. The relationship of the level of the analog input signal and the quantizing levels is such that the latter brackets the output of integrator 12. When the output of integrator 12 is the most negative, a zero voltage level is produced on all 16 outputs in classifier 13 while the most positive voltage is indicated by the classifier with a predetermined voltage level present on all of its 16 outputs. The absence of a voltage level in any one of the outputs of classifier 13 indicates that the voltage at the input to the classifier is less than the quantizing threshold corresponding to that output. Thus, classifier 13 presents a collection of voltage levels to the second input of subtractor 11 to indicate a particular one of the quantization levels within the classifier. The output of subtractor 11 supplies an input to intergrator integrator which is the difference between the analog input signal and the quantizing level indicated by classifier 13. Converter 17 transforms the information on bus 14 to a digital format (e.g., 5-bit digital words).

Coder 19, which is the circuitry described thus far, is of conventional design. Such arrangement is a sigma multilevel modulator due to the location of integrator 12 which not only acts as an analog accumulator but also integrates the analog input signal. As previously mentioned, this type of coder is also simply called a direct feedback coder. Such a coder is disclosed in U.S. Pat. No. 3,820,111 issued on June 25, 1974 to J. C. Candy, one of the joint inventors hereof, which includes in FIG. 3 a schematic circuit diagram of same. It should be stressed that the advantageous operation of the remaining circuitry in FIG. 1 as will become apparent hereinafter is primarily dependent upon the general coding configuration of direct feedback and can be readily adapted to provide beneficial performance when any of the other specific properties of the coder are changed.

The foregoing patent to Candy also discloses a converter which is connected to the output of a direct feedback coder and supplies a PCM signal of 8-bit digital words. This converter will be discussed now in order that the remaining circuitry in FIG. 1 can be thoroughly understood and appreciated. In the disclosed converter, an averaging of 16 coarsely quantized digital words is used to form one 8-bit digital output word. Mathematically, the resolution of the digital output signal is improved by a factor of $N/\sqrt{2}$ (where $N = 16$) over the input signal to the converter.

The improvement is due to the characteristic of the error or noise of each coarse quantized level in approximating the analog signal to be encoded in that some errors are positive while others are negative and produce cancellation in the averaging process. The basic reasonable assumption is that the quantizing noise supplied to the integrator is white noise that is random or uncorrelated so that combining a number of coarsely quantized levels through digital processing occasions self-cancellation of this noise.

The remaining circuitry in FIG. 1, which is also a converter, operates utilizing the foregoing assumption. However, a triangular weighting function is performed by the operation of two accumulators. The effect of this weighting function is to introduce equal weighting of the quantizing errors from the first to the final coarsely quantized values that contribute to the PCM output word of several digital positions. This process enhances the self-cancellation of errors or noise. The triangular weighting improves the resolution of the output signal over the input signal to the converter by $(N\sqrt{N/4})$ where N is the number of coarsely quantized values utilized to produce one PCM output word. In view of this relationship for improvement in resolution, it is evident that a large valve of N in the weighting process will provide a significant improvement in resolution over the conventional averaging technique. Specific design parameters were selected for each illustrative embodiment to provide a high resolution PCM signal wherein each digital output word is a 14-bit word.

The output signal of coder 19 is applied to the converter portion of FIG. 1. Digital adder 21 and register 22 serve as a first accumulator wherein each new digital word produced by coder 19 is added to the previous contents of register 22. In accordance with pulses from clock 18, register 22 reads and stores the output of adder 21. In this manner the contents of register 22 maintains a running accumulation or sum of the digital words produced by coder 19. This process continues throughout the predetermined group of all of the digital words which contribute to each output PCM word that is eventually produced by the arrangement in FIG. 1. At the end of each accumulation of the predetermined group of code words from coder 19, the output states of the internal stages of counter 24 switch the output of AND gate 26 to produce a carry pulse. The carry pulse resets the contents of register 22 back to zero so that the accumulation process may be repeated for the next PCM output word.

The running accumulation signal of register 22 on bus 23 is applied to digital combiner 27 which, together with register 28, serve as a second accumulator. As can be seen in FIG. 1, digital signals indicative of the contents of register 28 appear on bus 29 which supplies the other signal input to digital combiner 27. The remaining input of digital combiner 27 is a mode input to which is supplied the output of the final stage in counter 24. This signal is designated a mode signal which serves to instruct digital combiner 27 to either add or substract the signal on bus 23 indicative of the contents of register 22 respectively to or from the signals on bus 29 indicative of the contents of register 28. During the first portion of the accumulation process for forming a PCM output word, the state of the mode signal instructs digital combiner 27 to combine a signal indicative of the negative of the contents of register 22 with the signal on bus 29 for application to register 28. Thus, the accumulation is register 28 is a second accumulation of the negative of that in register 22 which is incremented to a new value by each set of digital signals occurring on bus 23. Register 28 also receives pulses from clock 18 which times the occurrence of the entrance of successive steps in the second accumulation in the register. The content of register 28 is changed in this manner until the mode signal produced by counter 24 changes state. Now signals indicative of the first accumulation unchanged in sign are directly combined with the signal on bus 29 by digital combiner 27 and change the contents in register 28 to agree in sign with the contents in register 22 at the end of the accumulation process. Thus, the mode signal maintains the second state for the remaining portion of the accumulation process.

Since the second accumulation is an ongoing process similar to the first accumulation, a state or level change in the mode signal applied to digital combiner 27 in approximately the middle of the accumulating process to formulate a PCM output word will result in a net accumulation in register 28 that agrees in encoded sign with the contents of register 22. Accordingly, if the encoded signs of the code words in themselves are of a predominance of one sign or another that sign will determine the sign of the accumulation in both registers. Each digital word from coder 19 arrives in register 28 one clock period delayed from the time it leaves the coder on line 14. Consequently, the carry pulse that clears register 28 is correspondingly delayed in delay 30 which typically might be a D-type flip-flop. At the end of the second accumulation process, the signal on bus 29 indicative of the net accumulation register 28 is read into register 31 by the delayed carry pulse from AND gate 26 via delay 30. Register 31 then supplies the output PCM words in the signal of improved resolution that is a digital replica of the analog input signal. The advantage of this arrangement of a separate output register such as register 31 is that the output signal can be read therefrom at any time from the appearance of each new word until just before the appearance of the immediately succeeding word.

A more complete explanation of the operation of the arrangement in FIG. 1 can be obtained by a consideration of the illustrative timing diagram in FIG. 2. The clock pulses shown in FIG. 2 depict the output of clock 18. In the arrangement of FIG. 2, 255 consecutive words are utilized from classifier 13 to produce a single output word for register 31 in FIG. 1. The clock signal is applied to counter 24 which divides by 256 by employing an internal cascade arrangement of eight stages. The outputs of various ones of the successive stages are depicted as the square waves in FIG. 2. The output of the eighth stage is applied to digital combiner 27 as a mode signal to define the add or subtract portions of the accumulation process in register 28. The output of all the internal stages in counter 24 are applied with the signal from clock 18 to AND gate 26 which produces a single pulse at the end of each of the 255 successive clock pulses. The single pulse depicted as the carry signal in FIG. 2 is applied to register 22 and resets it. After a delay of one clock interval this carry signal is applied to register 28 and resets it to zero in concurrence with the transfer of the signals indicative of the accumulation in register 28 to register 31 via bus 29. Thus, the next digital output word from register 31 will be based upon the next 255 output words from converter 19 since registers 22 and 28 are cleared after the formulation of the last output word which is applied to output register 31. The output word, in this case, is a high resolution PCM word of 14 bits.

Figure 4:
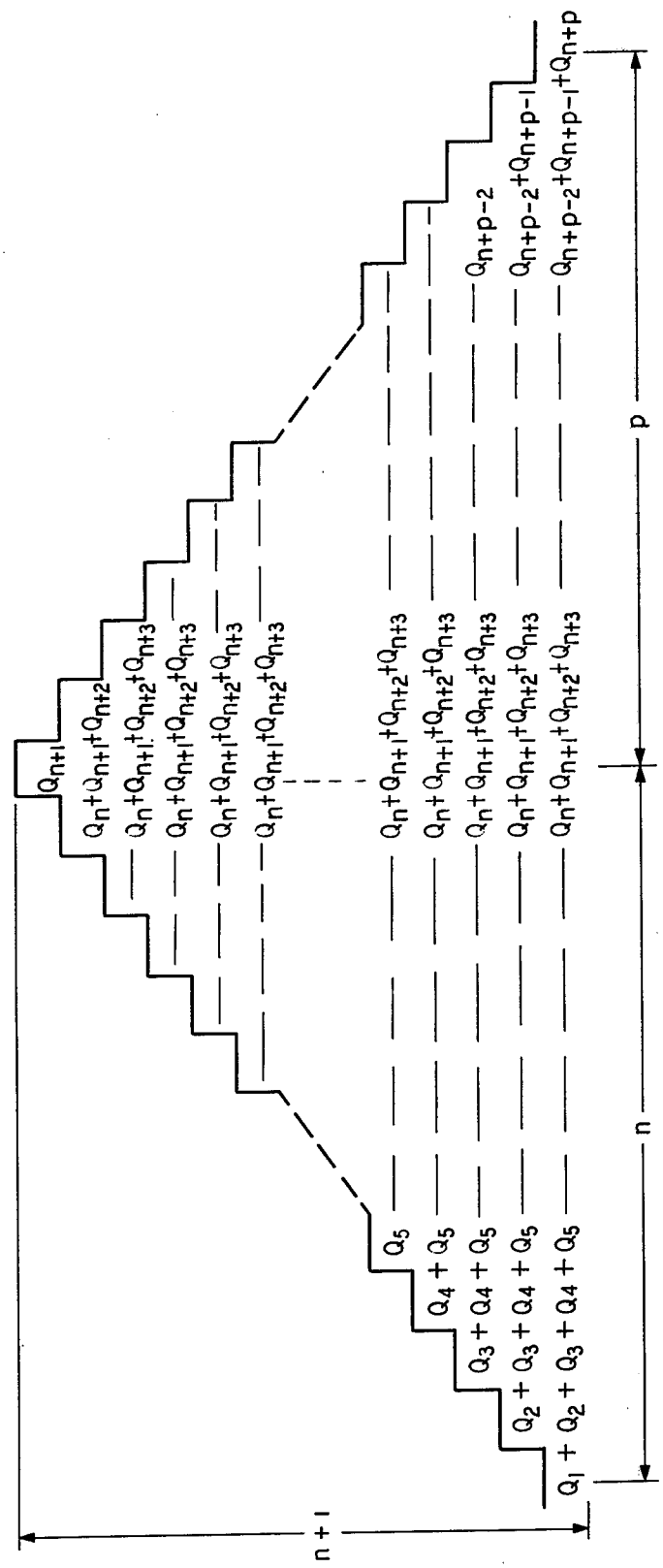
FIG. 4 graphically demonstrates the triangularly weighted accumulation used to produce the high resolution PCM output signal of FIG. 1.

FIGS. 3 and 4 serve to explain the weighting function in the accumulation process performed by the two accumulators in FIG. 1. FIG. 3 is a table which depicts the general contents of registers 22 and 28 throughout a typical cycle in the accumulation process. As shown in the table of FIG. 3, in the left-hand column, the successive outputs of coder 19 in FIG. 1 are listed in order from top to bottom where each value of Q denotes the code word or group of digital digits corresponding to the coarsely quantized level in classifier 13 which most nearly corresponds to the amplitude (sign and magnitude) of the output of integrator 12. It should be understood that the encoded sign and magnitude of each code word denoted by Q is a function of the analog input signal of coder 19 in FIG. 1. Accordingly, the signs and magnitudes self-contained in the various value of Q will have respective tendencies to change and to vary. The next wide column to the right in the table lists the contents of register 22 in FIG. 1 obtained by addition of the successive outputs of coder 19.

The next column to the right in the table of FIG. 3 indicates the mode of operation of digital combiner 27 during the depicted cycle of accumulation. Digital combiner 27 algebraically adds the encoded negative value of the encoded contents of register 22 to the previously accumulated contents in register 28 for each value of Q produced by coder 19 and stored in register 22. In other words, combiner 27 multiplies the encoded contents of register 22 by an encoded −1 and then in cooperation with register 27 performs the accumulation. The negative mode of operation is carried out until the $Q_n$ output of coder 19. The positive mode of operation is then used p successive times from $Q_{n+1}$ up to $Q_{n+p}$ where the positive value of the encoded contents of register 22 is algebraically added to the previously accumulated contents in register 28.

The wide column to the extreme right in the table lists the contents of register 28. At the end of the process after the $Q_{n+p}$ output of coder 19 occurs, it is evident from the table that register 28 contains a weighted accumulation. The number of times that each output of coder 19 in FIG. 1 denoted by a $Q$ with a specific subscript appears in the weighted accumulation up to $n + 1$ corresponds to its location in the order of successive outputs that is produced by coder 19. These values occur during the negative mode of accumulation. In the positive mode of accumulation beginning with $Q_{n+1}$ up to $Q_{n+p}$, the number of times that each $Q$ with a particular subscript occurs decreases with its order of succession until $Q_{n+p}$ which occurs only once. This operation provides a triangular weighting function as shown diagrammatically in FIG. 4. Since a positive accumulation is contained in register 28, it should be apparent that at the end of each cycle in the accumulation process, the actual encoded sign of the contents in register 28 agrees in sign with the encoded contents in register 22. It is pointed out that any further reference to sign in the accumulation process pertains to encoded sign and not polarity of the signals. Transfer of this weighted accumulation from register 28 to register 31 at the end of the accumulation cycle provides a PCM output word of high resolution.

Figure 5:
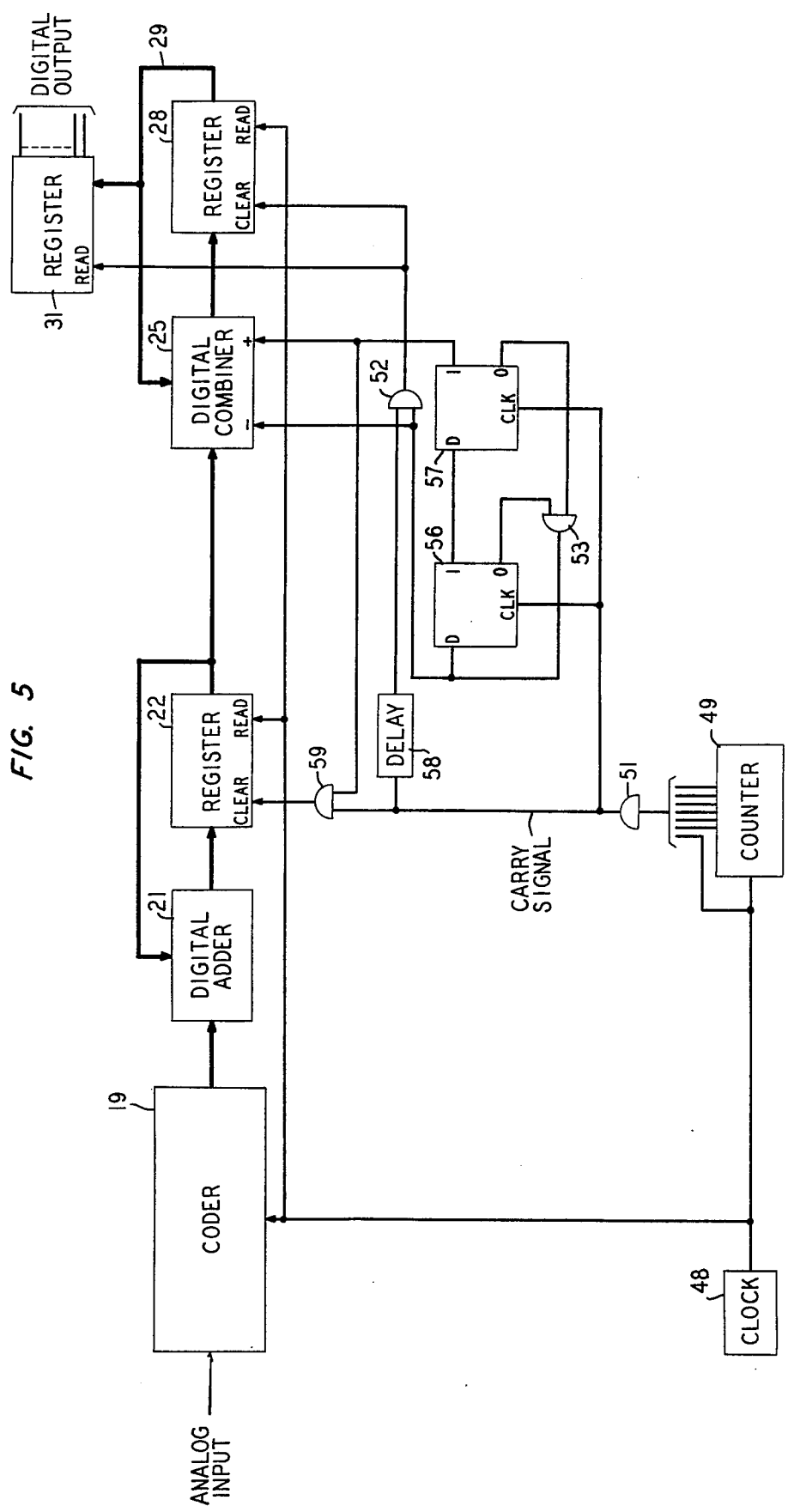
FIG. 5 is block diagram of a modified arrangement which performs a different weighted accumulation.

FIG. 5 is a block diagram of a converter similar to the converter of FIG. 1 but modified to provide a trapezoidal weighting function. The same reference numerals are assigned to the components in FIG. 5 which are indentical to the components in FIG. 1. The first three components, namely, coder 19, digital adder 21 and register 22, operate similarly to that disclosed in the discussion of FIG. 1 except that register 22 provides an accumulation of 191 successive output code words from coder 19 instead of the 255 output code words utilized in FIG. 1. Furthermore, digital combiner 25 of FIG. 5 has two mode inputs instead of the one of digital combiner 27 in FIG. 1. Digital combiner 25 also operates in a slightly different manner which will become apparent subsequently.

Before further discussion of the arrangement of FIG. 5 is presented, an overall discussion of its operation in relationship to the converter of FIG. 1 will be helpful. As previously stated, the converter of FIG. 5 is modified to provide trapezoidal weighting function. This weighting function is able to provide slightly better resolution than the triangular weighting function of FIG. 1. The reason for the improvement provided by trapezoidal weighting is that it more closely approximates optimum parabolic weighting which may be provided by employing complex digital multipliers. The output of FIG. 5 is also a high resolution PCM word of 14 bits. However, the slightly better resolution obtained with the trapezoidal weighting function enables coder 19 to run at a 25 percent slower rate. Accordingly, only 191 successive output code words of converter 19 are required to provide a 14-bit PCM code word of substantially the same resolution as that obtained by utilization of the arrangement depicted in FIG. 1.

A different timing arrangement is utilized in FIG. 5 to provide a trapezoidal weighting function. Clock 48 runs at a slower rate than clock 18 of FIG. 1 and counter 49 also has a different number of cascaded internal stages. The outputs of counter 49 are applied together with the clock 48 to AND gate 51 which supplies one of the two inputs to AND gate 59 and through delay 58 applies one of the two inputs to AND gate 52. The other input to AND gate 52 is supplied by AND gate 53 which has each of its inputs connected to an inverted or 0 output of D-type flip-flops 56 and 57. Gate 52 produces a pulse at the end of each accumulation cycle that applies the signal indicative of the contents of register 28 to register 31 and then clears register 28. Register 22 is cleared one clock period earlier by the output of AND gate 59 which is activated by the 1 output of flip-flop 57. The addition input to digital combiner 25 is supplied by the noninverted or 1 output of flip-flop 57. The output of gate 53 is also applied to the subtraction input of digital combiner 25.

Figure 6:
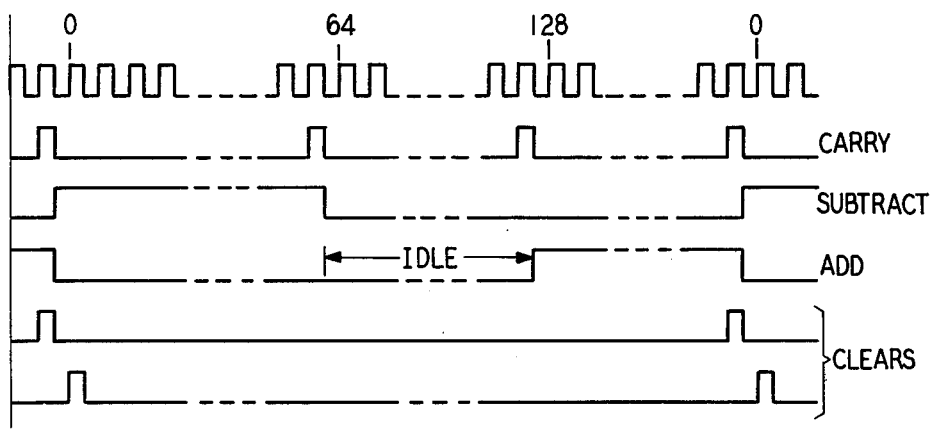
FIG. 6 is a waveform diagram which serves to illustrate operation associated with the arrangement of FIG. 5.

The illustrative timing diagram of FIG. 6 should be consulted to facilitate further explanation of the circuitry. In FIG. 6 the first line of pulses depicts the output signal of clock 48. In accordance with the occurrence of these pulses, coder 19 produces digital words which pass through adder 21 and are accumulated in register 22. All of the outputs of the internal stages of counter 49 are applied to AND gate 51 with the signal from clock 48 to produce the pulses of the carry signal wich is depicted as the second waveform in FIG. 6. The carry signal divides the accumulation cycle performed by register 28 in cooperation with digital combiner 25 into three portions.

The carry signal is used to clock flip-flops 56 and 57. The divide-by-three arrangement of flip-flops 56 and 57 and gate 53 provides mode signals, which are depicted as the subtract and add waveforms in FIG. 6, for digital combiner 25 that serve to direct the operation of the combiner during each of the three portions of the accumulation cycle. Initially, in each accumulation cycle within the duration of the first pulse in the carry signal, gate 52 produces a pulse depicted as the second clear signal in FIG. 6 that resets register 28 to zero just after the signal or bus 29 indicative of the contents of register 28 is read into register 31. The first clear signal in FIG. 6 resets register 22 one clock interval before the resetting of register 28. The operation of digital combiner 25 is identical to digital combiner 27 of FIG. 1 when either a one level is present at the subtraction input or a one level is applied to the addition input. More specifically, combiner 25 algebraically accumulates the negative of the content in register 22 in the first portion of the cycle and algebraically accumulates the positive of the content in register 22 in the third portion of the accumulation cycle. The primary difference in the operation of FIG. 5 from FIG. 1 occurs when combiner 25 is idle and produces no output in the second portion of the cycle while the first accumulator of digital adder 21 and register 22 remains active in producing a running accumulation of the code words produced by coder 19.

The signals produced by gate 53 and flip-flop 57 will now be discussed in connection with the operation of digital combiner 25. During the first portion of the accumulation cycle, flip-flops 56 and 57 are in the zero state and produce outputs that force the output of gate 53 to a one output signal level which places combiner 25 in the subtraction mode. In this mode, combiner 25 and register 28 operates in the same manner as combiner 27 and register 28 in FIG. 1 operate in the first portion of the accumulation cycle.

The occurrence of the next pulse in the carry signal of FIG. 6 in conjunction with the one level of gate 53 switches flip-flop 56 to the one state but flip-flop 57 remains in the zero state. With the occurrence of this second pulse, the changed inputs to gate 53 switch its output to a zero level. Since flip-flop 57 has remained in a zero state, a zero level signal is also applied to both mode inputs of combiner 25. Combiner 25 remains idle in response to the zero level of its two mode signals for the second portion of the cycle at which time no digital signals are entered into register 28 via combiner 25.

The third pulse in the carry signal of FIG. 6 in combination with the zero output of gate 53 simultaneously switches flip-flop 56 back to a zero state and transfers the noninverted one level output of flip-flop 56 to flip-flop 57. Flip-flop 57 now supplies a one level output signal to combiner 25 during the third portion of the cycle. The output of gate 53 remains unchanged since the zero and one levels applied thereto switch positions.

In the third portion of the accumulation cycle, combiner 25 and register 28 add the positive contents of register 22 to the partial accumulation retained in register 28 from the first portion of the accumulation cycle. The accumulations in each of the two accumulators of FIG. 5 are incremented by each output of coder 19. However, the operation of digital combiner 25 in response to the output signals produced by the divide-by-three arrangement of flip-flops 56 and 57 produces a weighting function in the accumulation of register 28 that has a trapezoidal shape. With the occurrence of the next pulse in the carry signal which signals the end of the accumulation cycle, the output of AND gate 59 switches to a one level resetting register 22 and flip-flop 57 is switched back to the zero state. This forces gate 53 to produce a one output level which changes gate 52 to a one output upon the occurrence of the delayed pulse from AND gate 51 at delay 58. Gate 52 produces the second clear pulse. The occurrence of this pulse at register 31 instructs it to read thereinto the signal on bus 29 indicative of the contents in register 28. Register 31 now contains the output PCM word. This pulse in the clear signal also directs register 28 to reset to zero so that it will be ready for the next accumulation cycle. Register 22 was also reset to zero, but this occurred one clock pulse earlier with the output of gate 59. It should be pointed out that further reference to the timing diagram of FIG. 6 provides a graphical chronology of the occurrence of the signals that provide this operation.

The table of FIG. 7 shows the contents of each of registers 22 and 28 throughout the accumulation cycle. The table of FIG. 7 is arranged to correspond to the table of FIG. 3. As can be ascertained from the table of FIG. 7, the variation in the number of times that each output of coder 19 is used in the accumulation in register 28 of FIG. 5 provides a weighting that corresponds to a trapezoid.

Figure 8:
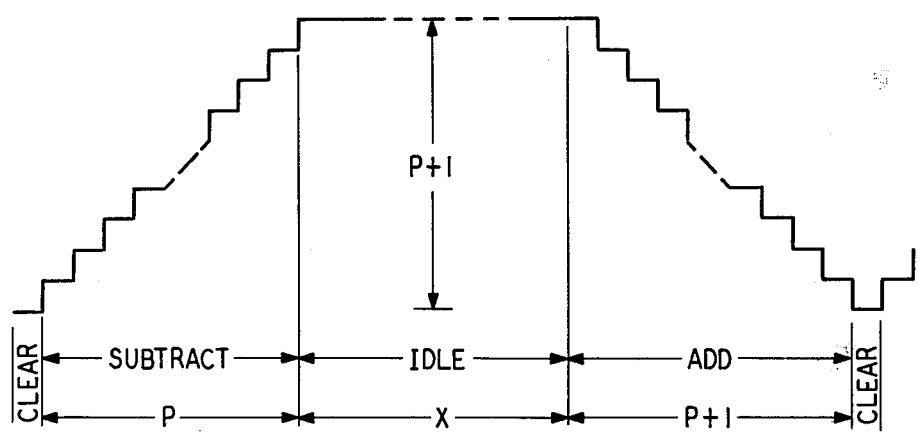
FIG. 8 illustrates the weighted accumulation corresponding to a trapezoid which is provided by the arrangement of FIG. 5.

FIG. 8 geometrically represents the trapezoidal weighting function in the accumulation in register 28 of FIG. 5. FIG. 8 illustrates the cumulative effect of the number of times each $Q_i$ output of coder 19 is used in accordance with the table of FIG. 7 but not shown in FIG. 8 for the sake of simplicity. The modes of operation of combiner 25 are depicted in the horizontal direction in FIG. 8.

It is to be understood that the arrangements of coders and converters described in the foregoing are merely illustrative of the application of the principles of the present invention. Similarly, the associated timing diagrams are merely illustrative of one manner in which the disclosed arrangements operate. Changes in the number of successive outputs of the coder to produce the high resolution PCM output of the converter are subject to the desired accuracy of the encoding process and the nature of the analog signal. Such changes, including numerous and varied other arrangements, may be utilized by those working in the art without departing from the spirit and scope of the invention.

What is claimed is:

1. In a digital message transmission system having a direct feedback coder producing an encoded replica of an input signal, said coder including quantizing means having multiple levels and the encoded replica including first code groups of a first plurality of digital bits, a converter for changing the encoded replica to a pulse code modulated signal of high signal resolution including second code groups of several digital bits, said converter comprising first accumulating means for receiving each of the first code groups and producing an output signal indicative of a running sum of a predetermined plurality of the received code groups, second accumulating means connected to receive the output signal and summing the negative of same for one portion of said predetermined plurality and summing the positive of same for another portion of said predetermined plurality to produce a net sum wherein the successive outputs of said coder during the one portion are included in the net sum an increasing number of times and the successive outputs of said coder during the other portion are included in the net sum a decreasing number of times, and output means coupled to said second accumulating means and producing the pulse code modulated signal wherein each second code group is indicative of one net sum produced by one predetermined plurality.

2. In a digital message transmission system having a direct feedback coder producing an encoded replica of an input signal, the combination as claimed in claim 1 wherein said first accumulating means comprises adding means having two inputs and an output, one of said two inputs connected to receive the encoded replica, and storing means connected to the output of said adding means and producing the output signal indicative of the running sum for said second accumulating means and the other of said two inputs.

3. In a digital message transmission system having a direct feedback coder producing an encoded replica of an input signal, the combination as claimed in claim 2 further comprising timing means for establishing and indicating the one portion and the other portion of said predetermined plurality and wherein said second accumulating means comprises combining means connected to said timing means having two signal inputs and an output, one of said two signal inputs connected to receive the output signal of said first accumulating means, and storing means connected to the output of said adding means and producing an output indicative of the net sum for said output means and the other of said two signal inputs, and said combining means algebraically adding the negative of the signal at the one of said two signal inputs to the output of said storing means during the one portion and algebraically adding the positive of the signal at the one of said two signal inputs to the output of said storing means during the other portion.

4. In a digital message transmission system having a direct feedback coder producing an encoded replica of an input signal, the combination as claimed in claim 3 wherein said timing means establishes a third portion of said predetermined plurality and signals same to said combining means, and said combining means remains idle during the third portion and inhibits the signal at the one of said two signal inputs from combining with the signal at the other of said two signal inputs and changing the net sum in said storing means.

5. A converter for providing a pulse code modulated signal from the coded output signal of a direct feedback coder to which is applied an input signal, said direct feedback coder including quantizing means having multiple quantizing steps and producing first code groups of a first plurality of digital bits, said converter comprising:

first accumulating means for receiving each of the first code groups and producing an accumulated output signal indicative of a running sum of a predetermined plurality of the first code groups;

second accumulating means connected to receive the accumulated output signal and summing the negative of same for a first portion of said predetermined plurality and summing the positive of same for another portion of said predetermined plurality so that the successive outputs of said coder are included in the second accumulation and increasing number of times during the first portion and a decreasing number of times during the other portion; and output means for supplying the contents of said second accumulator after each predetermined plurality in the form of a second code group of a second plurality of digital bits in the pulse code modulated signal which substantially corresponds to the input signal while minimizing the quantizing noise inherent to said direct feedback coder.

6. A converter in accordance with claim 5 further comprising timing means responsive to the occurrence of each of the first code groups and producing an output after each of said predetermined plurality of the first code groups, said first and second accumulating means receiving the output of said timing means and having their contents reset to zero after each of said predetermined plurality of the first code groups.

7. A converter in accordance with claim 6 wherein said timing means defines the first and other portions of said predetermined plurality and indicates same to said second accumulating means.

8. A converter in accordance with claim 7 wherein said timing means combines a third portion of said predetermined plurality and indicates same to said second accumulating means and said second accumulating means remaining idle during the third portion and not altering the net contents therein in response to the output of said second accumulating means.

9. A converter in accordance with claim 8 wherein said output means comprises a digital register connected to said timing means, said digital register reads the signal indicative of the contents of said second accumulating means thereinto after each of said predetermined plurality of the first code groups.

* * * * *

UNITED STATES PATENT AND TRADEMARK OFFICE
CERTIFICATE OF CORRECTION

PATENT NO. : 4,032,914

DATED : June 28, 1977

INVENTOR(S) : James Charles Candy and Yau-Chau Ching

It is certified that error appears in the above-identified patent and that said Letters Patent are hereby corrected as shown below:

Column 1, line 43, "basic" should read --basis--.
Column 2, line 14, "sum" should read --sums--.
Column 2, line 39, after "invention" insert --will--.
Column 3, line 21, after "integrator" second occurrence, substitute therefor --12--. Column 4, line 10, "valve" should read --value--. Column 4, line 53, first occurring "is" should read --in--. Column 7, line 60, "or" should read --on--.

Signed and Sealed this

Twenty-ninth Day of November 1977

[SEAL]

Attest:

RUTH C. MASON
Attesting Officer

LUTRELLE F. PARKER
Acting Commissioner of Patents and Trademarks